US006821450B2

(12) United States Patent
Truninger et al.

(10) Patent No.: US 6,821,450 B2
(45) Date of Patent: Nov. 23, 2004

(54) SUBSTRATE AND METHOD OF FORMING SUBSTRATE FOR FLUID EJECTION DEVICE

(75) Inventors: Martha A. Truninger, Corvallis, OR (US); Charles C. Haluzak, Corvallis, OR (US); Michael Monroe, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/347,888

(22) Filed: Jan. 21, 2003

(65) Prior Publication Data

US 2004/0141027 A1 Jul. 22, 2004

(51) Int. Cl.[7] ............................ B41J 2/04; H01L 21/00

(52) U.S. Cl. .............................. 216/27; 216/2; 216/11; 216/41; 216/74; 216/79; 347/63; 347/65; 438/21; 438/689

(58) Field of Search ................................ 216/2, 11, 17, 216/27, 41, 74, 79; 347/63, 65; 438/21, 689

(56) References Cited

U.S. PATENT DOCUMENTS

| | | | | |
|---|---|---|---|---|
| 4,894,664 | A | | 1/1990 | Tsung Pan |
| 4,961,821 | A | * | 10/1990 | Drake et al. .................. 438/21 |
| 5,124,717 | A | | 6/1992 | Campanelli et al. |
| 5,141,596 | A | | 8/1992 | Hawkins et al. |
| 5,387,314 | A | | 2/1995 | Baughman et al. |
| 5,513,431 | A | | 5/1996 | Ohno et al. |
| 5,569,355 | A | * | 10/1996 | Then et al. .................. 438/20 |
| 5,870,123 | A | | 2/1999 | Lorenze, Jr. et al. |
| 5,871,656 | A | | 2/1999 | Silverbrook |
| 6,000,787 | A | | 12/1999 | Weber et al. |
| 6,008,138 | A | | 12/1999 | Laermer et al. |
| 6,045,710 | A | | 4/2000 | Silverbrook |
| 6,096,656 | A | | 8/2000 | Matzke et al. |
| 6,107,209 | A | | 8/2000 | Ohkuma |
| 6,139,761 | A | | 10/2000 | Ohkuma |
| 6,234,608 | B1 | | 5/2001 | Genovese et al. |
| 6,305,080 | B1 | | 10/2001 | Komuro et al. |
| 6,312,612 | B1 | * | 11/2001 | Sherman et al. ............... 216/2 |
| 6,474,795 | B1 | * | 11/2002 | Lebens et al. ................ 347/82 |
| 6,475,402 | B2 | | 11/2002 | Nordstrom et al. |

FOREIGN PATENT DOCUMENTS

| | | |
|---|---|---|
| EP | 0841167 A2 | 5/1998 |
| EP | 0886307 A2 | 12/1998 |
| EP | 0978832 A2 | 2/2000 |
| GB | 2245366 A | 1/1992 |
| WO | WO 00/23376 | 4/2000 |

* cited by examiner

*Primary Examiner*—Nadine G. Norton
*Assistant Examiner*—Shamim Ahmed

(57) ABSTRACT

A method of forming an opening through a substrate having a first side and a second side opposite the first side includes forming a trench in the first side of the substrate, forming a mask layer within the trench, forming at least one hole in the mask layer, filling the trench and the at least one hole, forming a first portion of the opening in the substrate from the second side of the substrate to the mask layer, and forming a second portion of the opening in the substrate from the second side of the substrate through the at least one hole in the mask layer to the first side of the substrate.

24 Claims, 6 Drawing Sheets

SUBSTRATE AND METHOD OF FORMING SUBSTRATE FOR FLUID EJECTION DEVICE

CROSS-REFERENCE TO RELATED APPLICATIONS

This application is related to U.S. patent application Ser. No. 10/348,384, filed on Jan. 21. 2003, assigned to the assignee of the present invention, and incorporated herein by reference.

THE FIELD OF THE INVENTION

The present invention relates generally to fluid ejection devices, and more particularly to a substrate for a fluid ejection device.

BACKGROUND OF THE INVENTION

In some fluid ejection devices, such as printheads, a drop ejecting element is formed on a front side of a substrate and fluid is routed to an ejection chamber of the drop ejecting element through an opening or slot in the substrate. Often, the substrate is a silicon wafer and the slot is formed in the wafer by chemical etching. Existing methods of forming the slot through the substrate include etching into the substrate from the backside of the substrate to the front side of the substrate. The backside of the substrate is defined as a side of the substrate opposite of which the drop ejecting element is formed. Unfortunately, etching into the substrate from the backside all the way to the front side may result in misalignment of the slot at the front side and/or varying width of the slot at the front side.

Accordingly, it is desired to control formation of the slot through the substrate.

SUMMARY OF THE INVENTION

A method of forming an opening through a substrate having a first side and a second side opposite the first side includes forming a trench in the first side of the substrate, forming a mask layer within the trench, forming at least one hole in the mask layer, filling the trench and the at least one hole, forming a first portion of the opening in the substrate from the second side of the substrate to the mask layer, and forming a second portion of the opening in the substrate from the second side of the substrate through the at least one hole in the mask layer to the first side of the substrate.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as “top,” “bottom,” “front,” “back,” “leading,” “trailing,” etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
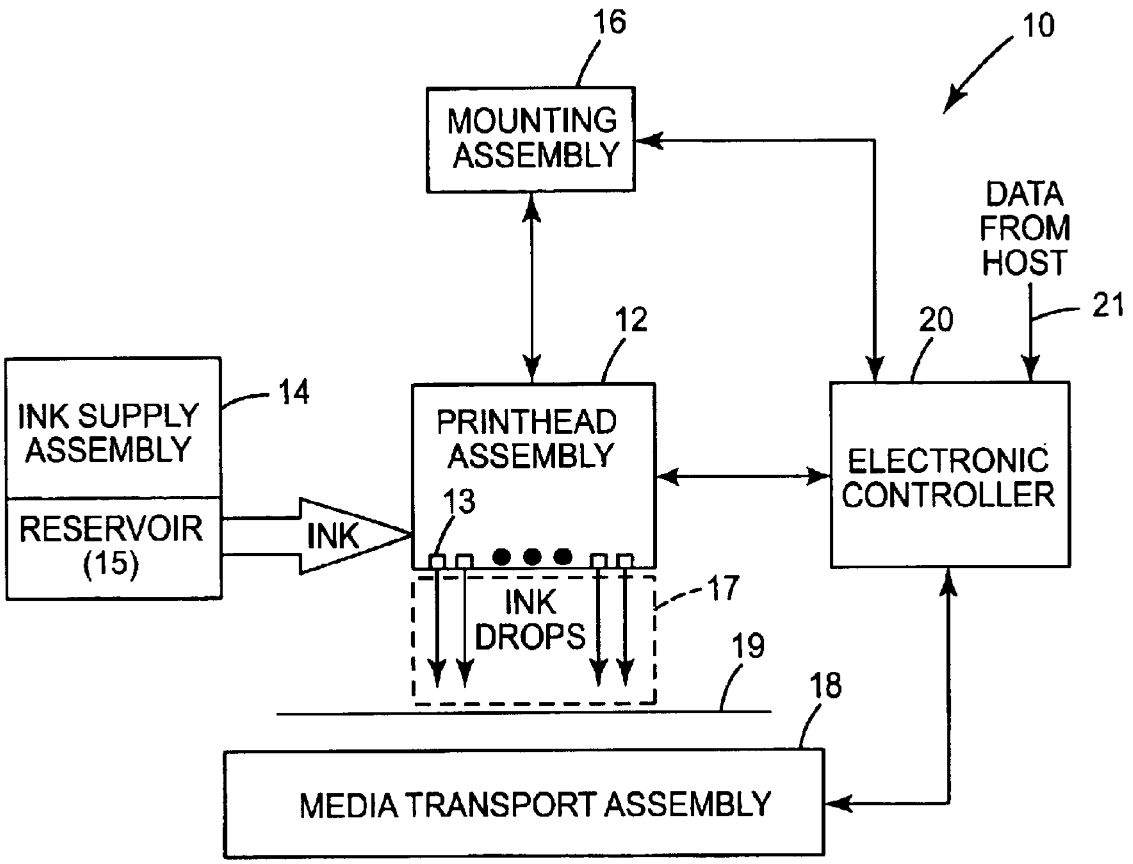
FIG. 1 is a block diagram illustrating one embodiment of an inkjet printing system according to the present invention.

FIG. 1 illustrates one embodiment of an inkjet printing system 10 according to the present invention. Inkjet printing system 10 constitutes one embodiment of a fluid ejection system which includes a fluid ejection assembly, such as an inkjet printhead assembly 12, and a fluid supply assembly, such as an ink supply assembly 14. In the illustrated embodiment, inkjet printing system 10 also includes a mounting assembly 16, a media transport assembly 18, and an electronic controller 20.

Inkjet printhead assembly 12, as one embodiment of a fluid ejection assembly, includes one or more printheads or fluid ejection devices which eject drops of ink or fluid through a plurality of orifices or nozzles 13. In one embodiment, the drops are directed toward a medium, such as print medium 19, so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as inkjet printhead assembly 12 and print medium 19 are moved relative to each other.

Ink supply assembly 14, as one embodiment of a fluid supply assembly, supplies ink to printhead assembly 12 and includes a reservoir 15 for storing ink. As such, in one embodiment, ink flows from reservoir 15 to inkjet printhead assembly 12. In one embodiment, inkjet printhead assembly 12 and ink supply assembly 14 are housed together in an inkjet or fluidjet cartridge or pen. In another embodiment, ink supply assembly 14 is separate from inkjet printhead assembly 12 and supplies ink to inkjet printhead assembly 12 through an interface connection, such as a supply tube.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly and mounting assembly 16 includes a carriage for moving inkjet printhead assembly 12 relative to media transport assembly 18. In another embodiment, inkjet printhead assembly 12 is a non-scanning type printhead assembly and mounting assembly 16 fixes inkjet printhead assembly 12 at a prescribed position relative to media transport assembly 18.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops, is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
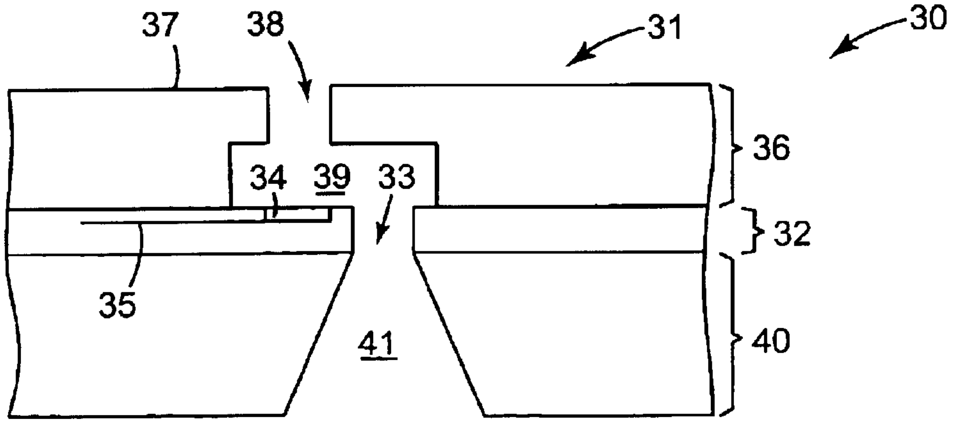
FIG. 2 is a schematic cross-sectional view illustrating one embodiment of a portion of a fluid ejection device according to the present invention.

FIG. 2 illustrates one embodiment of a portion of a fluid ejection device 30 of inkjet printhead assembly 12. Fluid ejection device 30 includes an array of drop ejecting elements 31. Drop ejecting elements 31 are formed on a substrate 40 which has a fluid (or ink) feed slot 41 formed therein. As such, fluid feed slot 41 provides a supply of fluid (or ink) to drop ejecting elements 31. Substrate 40 is formed, for example, of silicon, glass, or a stable polymer.

In one embodiment, each drop ejecting element 31 includes a thin-film structure 32 with a firing resistor 34, and an orifice layer 36. Thin-film structure 32 has a fluid (or ink) feed hole 33 formed therein which communicates with fluid feed slot 41 of substrate 40. Orifice layer 36 has a front face 37 and a nozzle opening 38 formed in front face 37. Orifice layer 36 also has a nozzle chamber 39 formed therein which communicates with nozzle opening 38 and fluid feed hole 33 of thin-film structure 32. Firing resistor 34 is positioned within nozzle chamber 39 and includes leads 35 which electrically couple firing resistor 34 to a drive signal and ground.

Thin-film structure 32 is formed, for example, by one or more passivation or insulation layers of silicon dioxide, silicon carbide, silicon nitride, tetraethylorthosilicate (TEOS), or other suitable material. In one embodiment, thin-film structure 32 also includes a conductive layer which defines firing resistor 34 and leads 35. The conductive layer is formed, for example, by poly-silicon, aluminum, gold, tantalum, tantalum-aluminum, or other metal or metal alloy.

In one embodiment, during operation, fluid flows from fluid feed slot 41 to nozzle chamber 39 via fluid feed hole 33. Nozzle opening 38 is operatively associated with firing resistor 34 such that droplets of fluid are ejected from nozzle chamber 39 through nozzle opening 38 (e.g., normal to the plane of firing resistor 34) and toward a medium upon energization of firing resistor 34.

Example embodiments of fluid ejection device 30 include a thermal printhead, as previously described, a piezoelectric printhead, a flex-tensional printhead, or any other type of fluidjet ejection device known in the art. In one embodiment, fluid ejection device 30 is a fully integrated thermal inkjet printhead.

Figure 3:
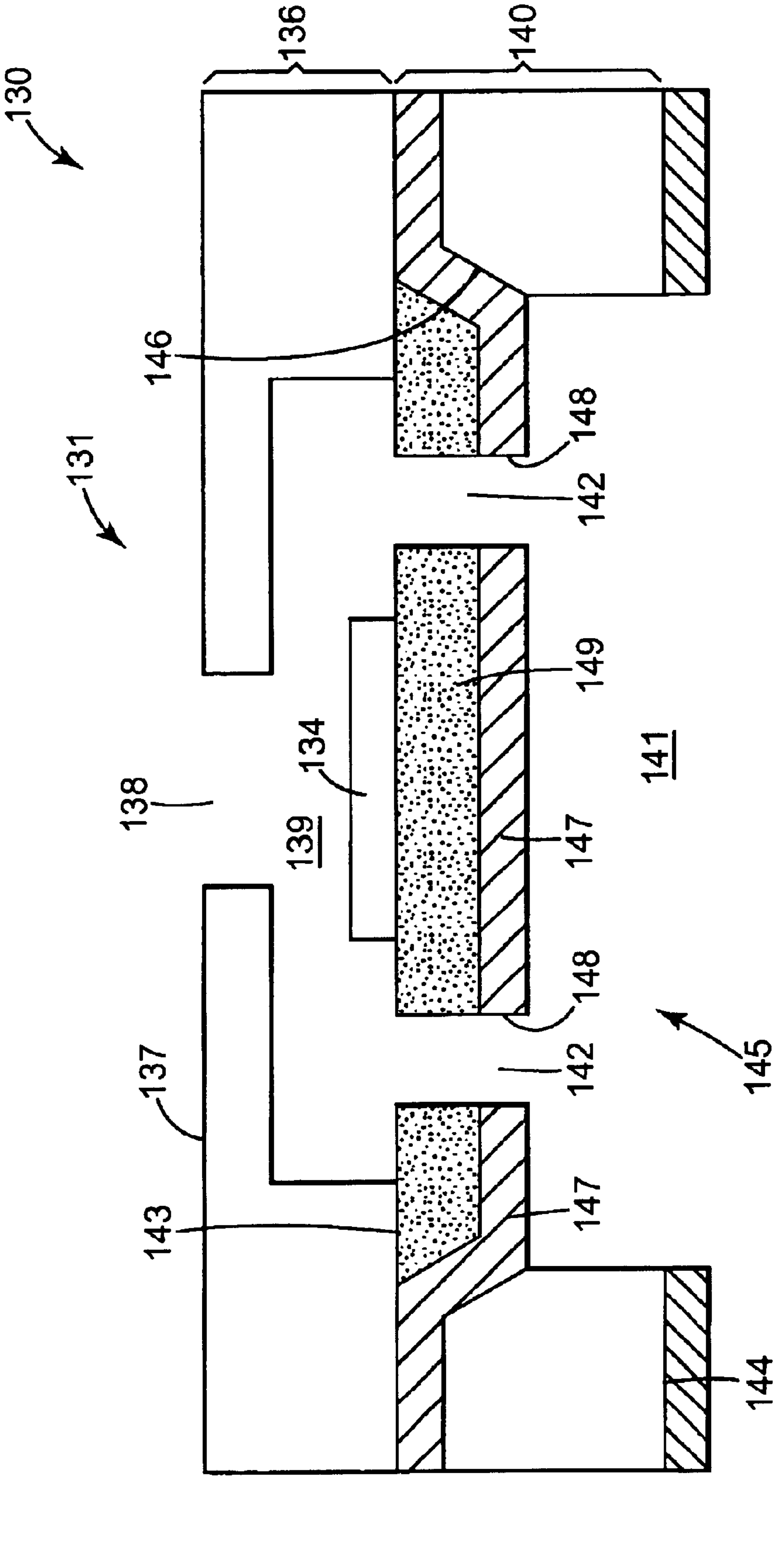
FIG. 3 is a schematic cross-sectional view illustrating one embodiment of a portion of a fluid ejection device formed on one embodiment of a substrate according to the present invention.

FIG. 3 illustrates another embodiment of a portion of a fluid ejection device 130 of inkjet printhead assembly 12. Fluid ejection device 130 includes an array of drop ejecting elements 131. Drop ejecting elements 131 are formed on a substrate 140 which has a fluid (or ink) feed slot 141 formed therein. As such, fluid feed slot 141 provides a supply of fluid (or ink) to drop ejecting elements 131. Substrate 140 is formed, for example, of silicon, glass, or a stable polymer.

In one embodiment, each drop ejecting element 131 includes a firing resistor 134 and an orifice layer 136. In addition, substrate 140 has one or more fluid (or ink) feed holes 142 formed therein which communicate with fluid feed slot 141. Orifice layer 136 has a front face 137 and a nozzle opening 138 formed in front face 137. Orifice layer 136 also has a nozzle chamber 139 formed therein which communicates with nozzle opening 138 and fluid feed holes 142.

In one embodiment, during operation, fluid flows from fluid feed slot 141 to nozzle chamber 139 via fluid feed holes 142. Nozzle opening 138 is operatively associated with firing resistor 134 such that droplets of fluid are ejected from nozzle chamber 139 through nozzle opening 138 and toward a medium upon energization of firing resistor 134.

As illustrated in the embodiment of FIG. 3, substrate 140 has a first side 143 and a second side 144. Second side 144 is opposite of first side 143 and, in one embodiment, oriented substantially parallel with first side 143. As such, fluid feed holes 142 communicate with first side 143 and fluid feed slot 141 communicates with second side 144 of substrate 140. Fluid feed holes 142 and fluid feed slot 141 communicate with each other so as to form a channel or opening 145 through substrate 140. As such, fluid feed slot 141 forms a first portion of opening 145 and fluid feed holes 142 form a second portion of opening 145. Opening 145 is formed in substrate 140 according to an embodiment of the present invention. In one embodiment, opening 145 is formed in substrate 140 by chemical etching and/or laser machining (lasing), as described below.

In one embodiment, substrate 140 has a trench 146 formed in first side 143 and includes an embedded mask layer 147 formed within trench 146. In addition, substrate 140 includes a fill material 149 disposed within trench 146. In one embodiment, embedded mask layer 147 is patterned so as to have one or more openings or holes 148 formed therein. As such, portions of embedded mask layer 147 provided adjacent to holes 148 mask or shield areas of fill material 149 during formation of opening 145 through substrate 140, as described below. Thus, embedded mask layer 147, including holes 148, define and control formation of fluid feed holes 142 in substrate 140. More specifically, holes 148 control lateral dimensions of fluid feed holes 142 and establish a location of fluid feed holes 142 at first side 143.

In one embodiment, fill material 149 is disposed within trench 146 over embedded mask layer 147. Fill material 149 is disposed within trench 146 so as to form first side 143 of substrate 140. Thus, in-one embodiment, firing resistor 134 and orifice layer 136 are formed on fill material 149. Fill material 149 includes, for example, an amorphous material, an amorphous silicon material, or a polysilicon material.

FIGS. 4A-4H illustrate one embodiment of forming an opening 150 through a substrate 160. In one embodiment, substrate 160 is a silicon substrate and opening 150 is formed in substrate 160 by chemical etching and/or laser machining (lasing), as described below. Substrate 160 has a first side 162 and a second side 164. Second side 164 is opposite of first side 162 and, in one embodiment, oriented substantially parallel with first side 162. Opening 150 communicates with first side 162 and second side 164 of substrate 160 so as to provide a channel or passage through substrate 160. While only one opening 150 is illustrated as being formed in substrate 160, it is understood that any number of openings 150 may be formed in substrate 160.

In one embodiment, substrate 160 represents substrate 140 of fluid ejection device 130 and opening 150 represents opening 145, including fluid feed slot 141 and fluid feed holes 142 formed in substrate 140. As such, drop ejecting elements 131 of fluid ejection device 130 are formed on first side 162 of substrate 160. Thus, first side 162 forms a front side of substrate 160 and second side 164 forms a back side of substrate 160 such that fluid flows through opening 150 and, therefore, substrate 160 from the back side to the front side. Accordingly, opening 150 provides a fluidic channel for the communication of fluid (or ink) with drop ejecting elements 131 through substrate 160.

Figure 4A:
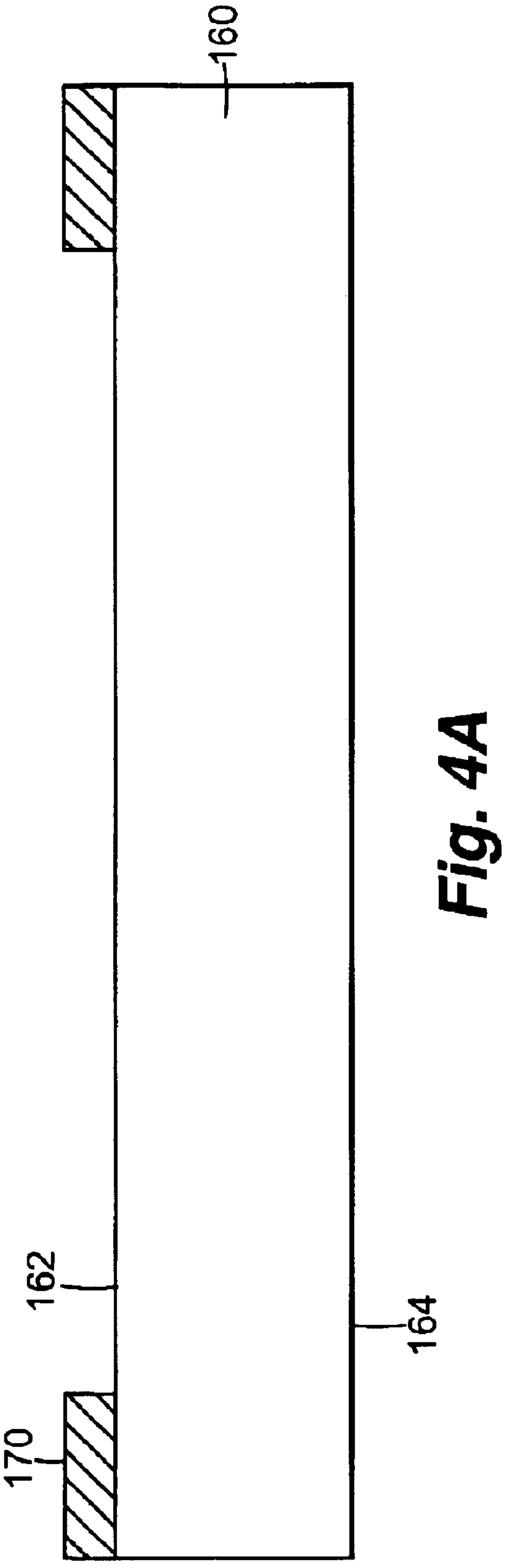
FIGS. 4A-4H illustrate one embodiment of forming an opening through a substrate according to the present invention.
Figure 4B:
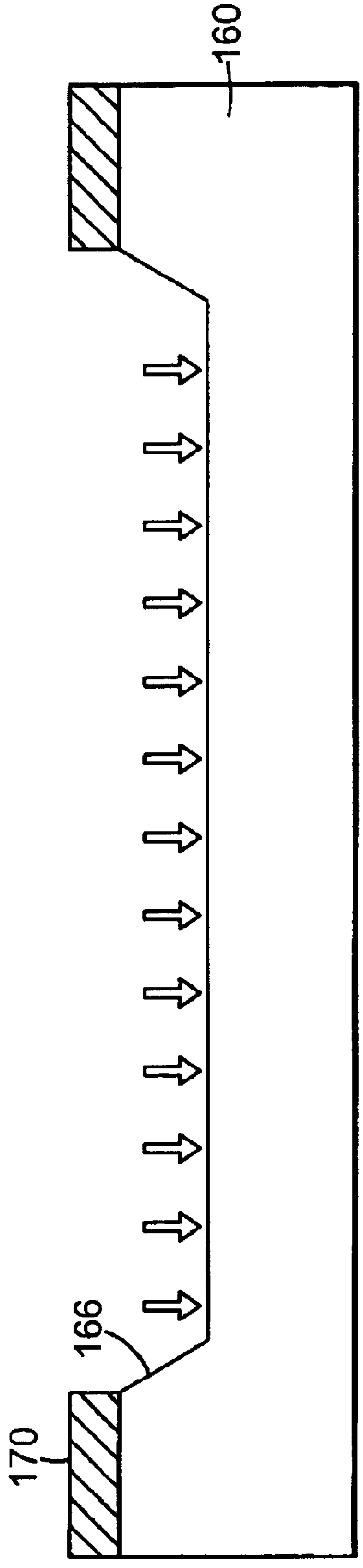

As illustrated in the embodiment of FIGS. 4A and 4B, before opening 150 is formed through substrate 160, a trench 166 is formed in substrate 160. In one embodiment, trench 166 is formed in substrate 160 by chemical etching into substrate 160, as described below.

In one embodiment, as illustrated in FIG. 4A, to form trench 166 in substrate 160, a masking layer 170 is formed on substrate 160. More specifically, masking layer 170 is formed on first side 162 of substrate 160. Masking layer 170 is used to selectively control or block etching of first side 162. As such, masking layer 170 is formed along first side 162 of substrate 160 and patterned to expose areas of first side 162 and define where trench 166 is to be formed in substrate 160.

In one embodiment, masking layer 170 is formed by deposition and patterned by photolithography and etching to define exposed portions of first side 162 of substrate 160. More specifically, masking layer 170 is patterned to outline where trench 166 (FIG. 4B) is to be formed in substrate 160 from first side 162. Preferably, trench 166 is formed in substrate 160 by chemical etching, as described below. Thus, masking layer 170 is formed of a material which is resistant to etchant used for etching trench 166 into substrate 160. Examples of a material suitable for masking layer 170 include silicon dioxide, silicon nitride, or any other suitable dielectric material, or photoresist or any other photoimageable material.

Next, as illustrated in the embodiment of FIG. 4B, trench 166 is formed in substrate 160. In one embodiment, trench 166 is formed in substrate 160 by etching into first side 162. Preferably, trench 166 is formed in substrate 160 using an anisotropic chemical etch process. In one embodiment, the etch process is a dry etch, such as a plasma based fluorine ($SF_6$) etch. In another embodiment, the etch process is a wet etch and uses a wet anisotropic etchant such as tetra-methyl ammonium hydroxide (TMAH), potassium hydroxide (KOH), or other alkaline etchant.

After trench 166 is formed in substrate 160, masking layer 170 is stripped or removed from substrate 160. As such, first side 162 of substrate 160 is revealed or exposed. In one embodiment, when masking layer 170 is formed of an oxide, masking layer 170 is removed, for example, by a chemical etch. In another embodiment, when masking layer 170 is formed of photoresist, masking layer 170 is removed, for example, by a resist stripper.

Figure 4C:
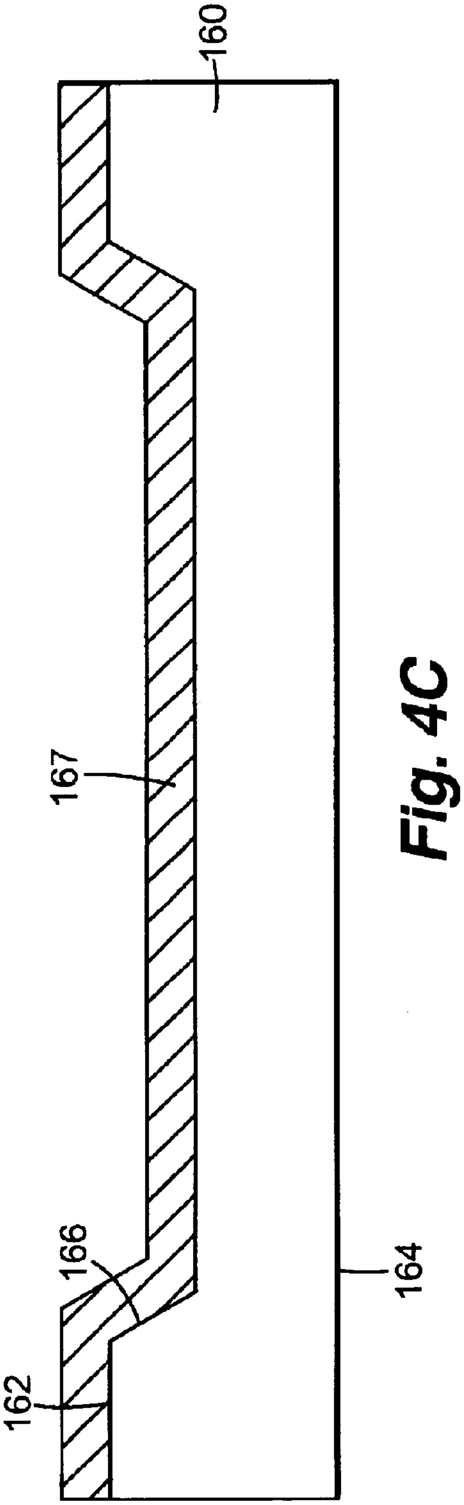

As illustrated in the embodiment of FIG. 4C, after trench 166 is formed in substrate 160 and masking layer 170 is removed from substrate 160, an embedded mask layer 167 is formed within trench 166 and on first side 162 of substrate 160. In one embodiment, embedded mask layer 167 is formed by growing an etch resistant material within trench 166 and on first side 162 of substrate 160. In another embodiment, embedded mask layer 167 is formed by depositing the etch resistant material within trench 166 and on first side 162 of substrate 160. The etch resistant material includes, for example, an oxide, a nitride, an oxynitride, silicon carbide, or any other suitable deposited or thermally grown film.

Figure 4D:
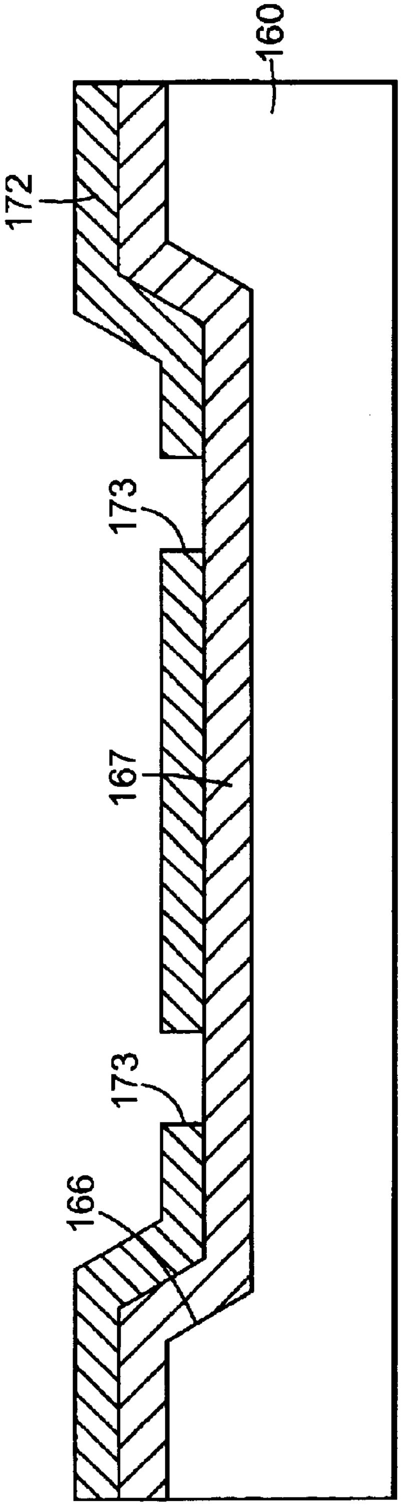

Next, as illustrated in the embodiment of FIG. 4D, a masking layer 172 is formed over embedded mask layer 167. In one embodiment, masking layer 172 is patterned with one or more openings 173 to expose areas of embedded mask layer 167 within trench 166.

In one embodiment, masking layer 172 is formed by deposition or spray coating and patterned by photolithography and etching to define exposed portions of embedded mask layer 167. More specifically, masking layer 172 is patterned to outline where holes 168 (FIG. 4E) are to be formed in embedded mask layer 167 from first side 162 of substrate 160. Preferably, holes 168 are formed in embedded mask layer 167 by etching, as described below. Thus, masking layer 172 is formed of a material which is resistant to etchant used for etching holes 168 into embedded mask layer 167. In one embodiment, the material includes photoresist.

Figure 4E:
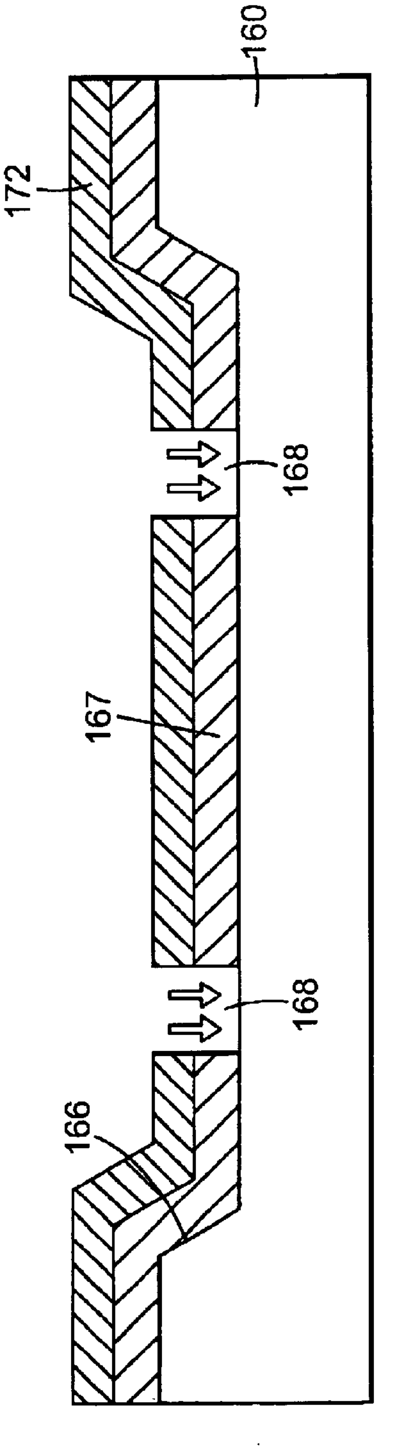

Next, as illustrated in the embodiment of FIG. 4E, holes 168 are formed in embedded mask layer 167. Holes 168 are spaced along embedded mask layer 167 within trench 166 so as to define where opening 150 is to communicate with first side 162 of substrate 160. While two holes 168 are illustrated as being formed in embedded mask layer 167, it is understood that any number of holes 168 may be formed in embedded mask layer 167.

In one embodiment, holes 168 are formed in embedded mask layer 167 by etching into embedded mask layer 167 from first side 162 of substrate 160. Preferably, holes 168 are formed in embedded mask layer 167 using an anisotropic chemical etch process. In one embodiment, the etch process forms holes 168 with substantially parallel sides. In one embodiment, the etch process is a dry etch, such as a plasma based fluorine etch. In a particular embodiment, the dry etch is a reactive ion etch (RIE). In another embodiment, the etch process is a wet etch, such as a buffered oxide etch (BOE).

After holes 168 are formed in substrate 160, masking layer 172 is stripped or removed from embedded mask layer 167. As such, embedded mask layer 167 with holes 168 is revealed or exposed. In one embodiment, when masking layer 172 is formed of photoresist, masking layer 172 is removed, for example, by a resist stripper.

Figure 4F:
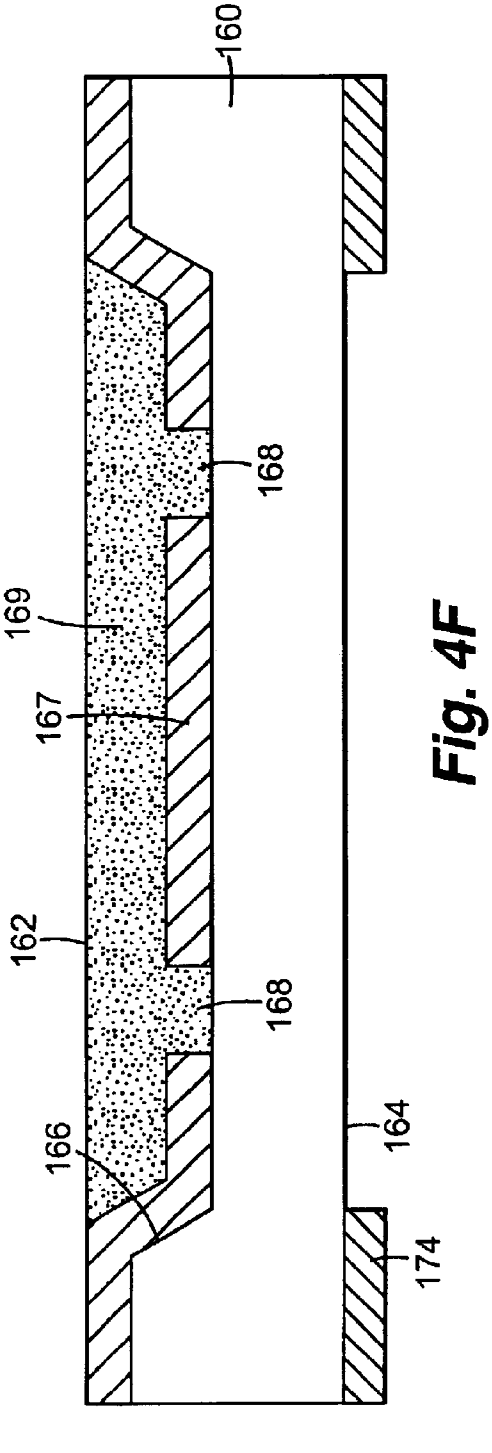

As illustrated in the embodiment of FIG. 4F, after holes 168 are formed in embedded mask layer 167 and masking layer 172 is removed, trench 166 is filled. Trench 166 is filled by depositing a fill material 169 over first side 162 of substrate 160 and embedded mask layer 167 so as to fill trench 166. Fill material 169 is disposed within trench 166 so as to fill holes 168 of embedded mask layer 167. Fill material 169 may include, for example, an amorphous material, an amorphous silicon material, or a polycrystalline silicon material.

In one embodiment, after fill material 169 is deposited within trench 166, fill material 169 is planarized to create a substantially flat surface. More specifically, fill material 169 is planarized so as to redefine first side 162 of substrate 160. In one embodiment, fill material 169 is planarized by a chemical mechanical polishing (CMP) or resist etch back process. While fill material 169 is illustrated as being planarized to embedded mask layer 167 as formed on first side 162 of substrate 160, it is within the scope of the present invention for fill material 169 to be planarized to substrate 160.

Also, as illustrated in the embodiment of FIG. 4F, a masking layer 174 is formed on second side 164 of substrate 160. Masking layer 174 is patterned to expose an area of second side 164 and define where substrate 160 is to be etched to form a first portion 152 of opening 150 (FIGS. 4G-4H).

Figure 4G:
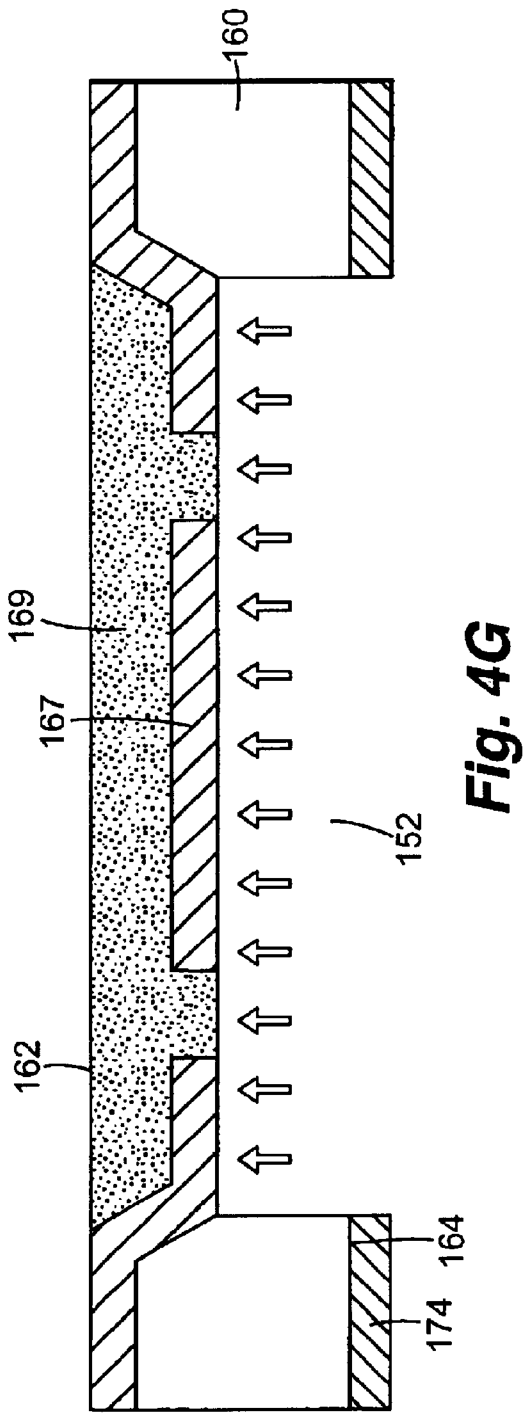

Next, as illustrated in the embodiment of FIG. 4G, first portion 152 of opening 150 is etched into substrate 160 from second side 164. As such, first portion 152 of opening 150 is formed by etching an exposed portion or area of substrate 160 from second side 164 toward first side 162. Etching into substrate 160 from second side 164 toward first side 162 continues until first portion 152 of opening 150 is formed to embedded mask layer 167.

Figure 4H:
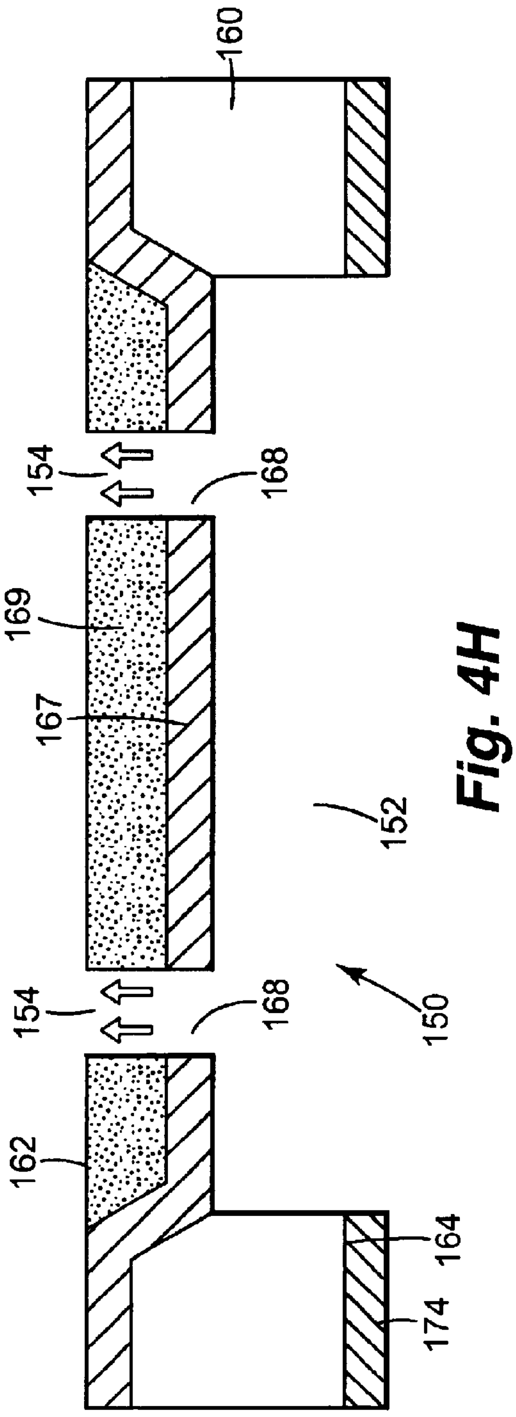

As illustrated in the embodiment of FIG. 4H, after first portion 152 of opening 150 is formed, a second portion 154 of opening 150 is etched into fill material 169, which redefines first side 162 of substrate 160, from second side 164 through first portion 152 and through holes 168 of embedded mask layer 167. Etching into substrate 160 from second side 164 through first portion 152 and through holes 168 of embedded mask layer 167 continues through fill material 169 to first side 162 such that second portion 154 of opening 150 is formed. As such, opening 150 is formed through substrate 160.

In one embodiment, opening 150, including first portion 152 and second portion 154, is formed using an anisotropic etch process which forms opening 150 with substantially parallel sides. In one embodiment, the etch process is a dry etch, such as a plasma based fluorine ($SF_6$) etch. In a particular embodiment, the dry etch is a reactive ion etch (RIE) and, more specifically, a deep RIE (DRIE). In another embodiment, first portion 152 of opening 150 is formed in substrate 160 by a laser machining process. Thereafter, second portion 154 of opening 150 is formed in substrate 160 by a dry etch process.

During the deep RIE, an exposed section is alternatively etched with a reactive etching gas and coated until a hole is formed. In one exemplary embodiment, the reactive etching gas creates a fluorine radical that chemically and/or physically etches the material. In this exemplary embodiment, a polymer coating that is selective to the etchant used is deposited on inside surfaces of the forming hole, including the sidewalls and bottom. The coating is created by using carbon-fluorine gas that deposits $(CF_2)_n$, a Teflon-like material or Teflon-producing monomer, on these surfaces. In this embodiment, the polymer substantially prevents etching of the sidewalls during the subsequent etch(es). The gases for the etchant alternate with the gases for forming the coating on the inside of the hole.

When etching first portion 152 of opening 150 into substrate 160 from second side 164, embedded mask layer 167 acts as an etch stop layer which substantially limits or establishes a depth of first portion 152. As such, forming of first portion 152 proceeds to embedded mask layer 167. In addition, when etching second portion 154 into substrate 160 from first portion 152, holes 168 of embedded mask layer 167 substantially limit etching of substrate 160 including, more specifically, fill material 169 to areas within holes 168 and prevent etching laterally of holes 168. Thus, holes 168 control where opening 150 communicates with first side 162. Furthermore, etching first portion 152 and second portion 154 of opening 150 into substrate 160 from second side 164 results in a complementary metal oxide semiconductor (CMOS) compatible process whereby opening 150 may be formed after integrated circuits are formed on first side 162 of substrate 160.

While the above description refers to the inclusion of substrate 160 having opening 150 formed therein in an inkjet printhead assembly, it is understood that substrate 160 having opening 150 formed therein may be incorporated into other fluid ejection systems including non-printing applications or systems as well as other applications having fluidic channels through a substrate, such as medical devices. Accordingly, the present invention is not limited to printheads, but is applicable to any slotted substrates.

Although specific embodiments have been illustrated and described herein for purposes of description of one preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming an opening through a substrate having a first side and a second side opposite the first side, the method comprising:

forming a trench in the first side of the substrate;

forming a mask layer within the trench;

forming at least one hole in the mask layer;

filling the trench and the at least one hole in the mask layer;

forming a first portion of the opening in the substrate from the second side of the substrate to the mask layer; and forming a second portion of the opening in the substrate from the second side of the substrate through the at least one hole in the mask layer to the first side of the substrate.

2. The method of claim 1, wherein the substrate is formed of silicon.

3. The method of claim 1, wherein forming the trench in the first side of the substrate includes etching into the substrate from the first side.

4. The method of claim 1, wherein forming the mask layer within the trench includes at least one of growing and depositing an etch resistant material within the trench.

5. The method of claim 4, wherein the etch resistant material includes one of an oxide, a nitride, an oxynitride, and silicon carbide.

6. The method of claim 1, wherein forming the at least one hole in the mask layer includes etching into the mask layer from the first side of the substrate.

7. The method of claim 1, wherein forming the at least one hole in the mask layer includes patterning the mask layer.

8. The method of claim 1, wherein filling the trench and the at least one hole includes redefining the first side of the substrate.

9. The method of claim 1, wherein filling the trench includes embedding the mask layer.

10. The method of claim 1, wherein filling the trench includes filling the trench with one of an amorphous material, an amorphous silicon material, and a polycrystalline silicon material.

11. The method of claim 1, wherein forming the first portion of the opening in the substrate includes one of etching and laser machining into the substrate.

12. The method of claim 11, wherein forming the second portion of the opening in the substrate includes etching through the at least one hole in the mask layer.

13. A method of forming a substrate for a fluid ejection device, the method comprising:

forming a trench in a first side of the substrate;

forming a mask layer within the trench;

forming at least one hole in the mask layer;

filling the trench and the at least one hole in the mask layer; and forming a fluid opening through the substrate, including forming a fluid channel in the substrate from a second side of the substrate opposite the first side to the mask layer and forming a fluid feed hole in the substrate through the at least one hole in the mask layer to the first side of the substrate.

14. The method of claim 13, wherein the substrate is formed of silicon.

15. The method of claim 13, wherein forming the trench in the first side of the substrate includes etching into the substrate from the first side.

16. The method of claim 13, wherein forming the mask layer within the trench includes at least one of growing and depositing an etch resistant material within the trench.

17. The method of claim 16, wherein the etch resistant material includes one of an oxide, a nitride, an oxynitride, and silicon carbide.

18. The method of claim 13, wherein forming the at least one hole in the mask layer includes etching into the mask layer from the first side of the substrate.

19. The method of claim 13, wherein forming the at least one hole in the mask layer includes patterning the mask layer.

20. The method of claim 13, wherein filling the trench and the at least one hole includes redefining the first side of the substrate.

21. The method of claim 13, wherein filling the trench includes embedding the mask layer.

22. The method of claim 13, wherein filling the trench includes filling the trench with one of an amorphous material, an amorphous silicon material, and a polycrystalline silicon material.

23. The method of claim 13, wherein forming the fluid channel in the substrate includes one of etching and laser machining into the substrate.

24. The method of claim 23, wherein forming the fluid feed hole in the substrate includes etching through the at least one hole in the mask layer.

* * * * *